United States Patent [19]

Dumont

[11] Patent Number: 4,742,564
[45] Date of Patent: May 3, 1988

[54] TUNING ALIGNMENT DATA MEMORY DEVICE FOR TUNING CIRCUITS TUNABLE TO SELECTABLE FREQUENCIES

[75] Inventor: Daniel Dumont, Douvres, France

[73] Assignee: U.S. Philips Corporation, New York, N.Y.

[21] Appl. No.: 35,106

[22] Filed: Apr. 6, 1987

[30] Foreign Application Priority Data

Apr. 8, 1986 [FR] France .................................. 86 04980

[51] Int. Cl.⁴ .......................... H04B 11/16; H04B 1/26
[52] U.S. Cl. .................................... 455/186; 455/195; 455/197; 358/191.1
[58] Field of Search ............... 455/186, 185, 164, 197, 455/166, 195, 169, 192; 365/189, 192, 231; 358/191.1, 193.1

[56] References Cited

U.S. PATENT DOCUMENTS

| | | | |
|---|---|---|---|
| 4,361,909 | 11/1982 | Theriault | 455/197 |
| 4,491,975 | 1/1985 | Ito | 455/186 |
| 4,503,465 | 3/1985 | Wine | 455/186 |
| 4,608,712 | 8/1986 | Fedde | 455/186 |

OTHER PUBLICATIONS

"Session V—TV Signal Processing II," Dumont et al., 1985 IEEE, pp. 78-79.

Primary Examiner—Robert L. Griffin
Assistant Examiner—Curtis Kuntz
Attorney, Agent, or Firm—Gregory P. Gadson

[57] ABSTRACT

The invention relates to a tuning memory device for tuning circuits to selectable frequencies and in which digital tuning data corresponding to said frequencies are stored in a programmable memory. For each selectable frequency the programmable memory contains an information element indicating whether writing said line has been effected correctly. A logic frequency-selection circuit includes a buffer register (REG) receiving address data from a BUS, which data are loaded in an up/down counter UP/DN, and a shift register $L_1 \ldots L_n$ which is clocked by a clock signal (MW,CR). Each time a defective row of the memory is detected (signal BLD), the up/down counter UPDN is decremented by one unit so a defective row is not counted. When the up/down counter reaches a predetermined count, identified by a gate 40, the shift register is positioned to the desired row corresponding to the selected frequency and addresses via the output of a corresponding register multivibrator ($L_1 \ldots L_n$) a row of the programmable memory.

4 Claims, 2 Drawing Sheets in a programmable memory (PROM) associated with said circuits, being selectable by a logic frequency selection circuit and suitable for having the associated digital tuning alignment data correspond to the selectable frequencies.

TUNING ALIGNMENT DATA MEMORY DEVICE FOR TUNING CIRCUITS TUNABLE TO SELECTABLE FREQUENCIES

BACKGROUND OF THE INVENTION

The present invention has for its object to provide a tuning alignment data memory device for tuning circuits tunable to selectable frequencies in which digital tuning alignment data corresponding to said frequencies are stored in a programmable memory (PROM) associated with said circuits, being selectable by a logic frequency selection circuit and suitable for having the associated digital tuning alignment data correspond to the selectable frequencies.

Such a tuning alignment data memory device is disclosed in the article by Daniel Dumont and Arno Neelen, entitled "Computer Controlled Television Channel Selection and Tuner Alignment", published in IEEE International Conference on Consumer Electronics June 5, 1985 pages 78–79.

Said article describes that the tuner of a television receiver is aligned in the factory by means of a computer. The digital tuning alignment data stored in the programmable memory correspond for each selectable frequency to supply voltage correction values for three varicap diodes which form part of three tuning circuits and which are coarsely tuned in a manner identical to that of a local oscillator. For each television channel a set of three digital tuning alignment data each corresponding to a supply voltage correction value for a varicap diode are therefore stored in the memory. Thus, considerable time is saved compared with the conventional manual aligning technique, consisting in adjusting each individual self-inductance of the tuned circuits, but there is a disadvantage.

Because, when for at least one of the selectable frequencies the writing in the programmable memory is faulty, be it only for one of the varicap diode correction voltage values of only one of the selectable frequencies, then the tuner is not suitable for use, which results in it being rejected when tested during a factory inspection.

SUMMARY OF THE INVENTION

The invention has for its object to provide a tuning alignment data memory device which does not have these disadvantages and which can be used even if faulty data have been entered in the programmable memory.

To that end, a tuning alignment data memory device as mentioned in the preamble, according to the invention is characterized in that the programmable memory comprises for each selectable frequency a write row containing a write information position for a write information element indicating whether tuning data written in this row have been written correctly or not, in that tuning alignment data written in these rows are sequentially arranged in accordance with a predetermined frequency order, in that for each defective write row the digital tuning alignment data of a defective write row are written again in the subsequent write row and in that the logic frequency selection circuit comprises:

a buffer register receiving a first address corresponding to a selected frequency;

an up/down counter clocked by a first clock signal until it has reached a second address;

a shift register clocked by said first clock signal and acting such that its output sequentially addresses write rows of the programmable memory;

a first logic gate detecting whether the up/down counter has reached said second address and whose output blocks said first clock signal when the second address has been reached;

and a logic detection circuit of said write information element whose output is designed such as to decrement the up/down counter by one step in the case in which said write information element corresponds to a defective write row, such that, for a first address corresponding to a $k^{th}$ frequency, the shift register remains in a position in which it addresses a validly written $k^{th}$ row of the programmable memory, after having sequentially scanned validly written $(k-1)$ first rows and, if necessary, defectively written rows.

In synchronism with said first address, the buffer register may receive a load authorization signal, which authorizes a passage of one pulse of a second clock signal having the same period as the first clock signal, but shifted in time relative to this first clock signal, to be applied to the clock signal input of a D-type bistable multivibrator whose input receives from the buffer register a signal which is representative of an effective load of the first address, and whose output, when it is in its high state, unlocks the first clock signal, and is reset to zero by an output signal of the first logic gate.

In accordance with a preferred embodiment, the shift register is reset to zero by said load authorizing signal and at its input receives said signal which is representative of the effective load of the first count in the buffer register. The device may alternatively include a second logic gate which receives an output signal of the logic detection circuit and also a signal of a third clock having the same period as the first clock signal, but shifted in time relative to this first clock signal, in such a manner as to synchronize the up/down counter when it is decremented by one step.

BRIEF DESCRIPTION OF THE DRAWINGS

The invention will be better understood from the following description which is given, by way of non-limitative example, with reference to the accompanying drawings in which.

DETAILED DESCRIPTION OF THE INVENTION

Figure 1:
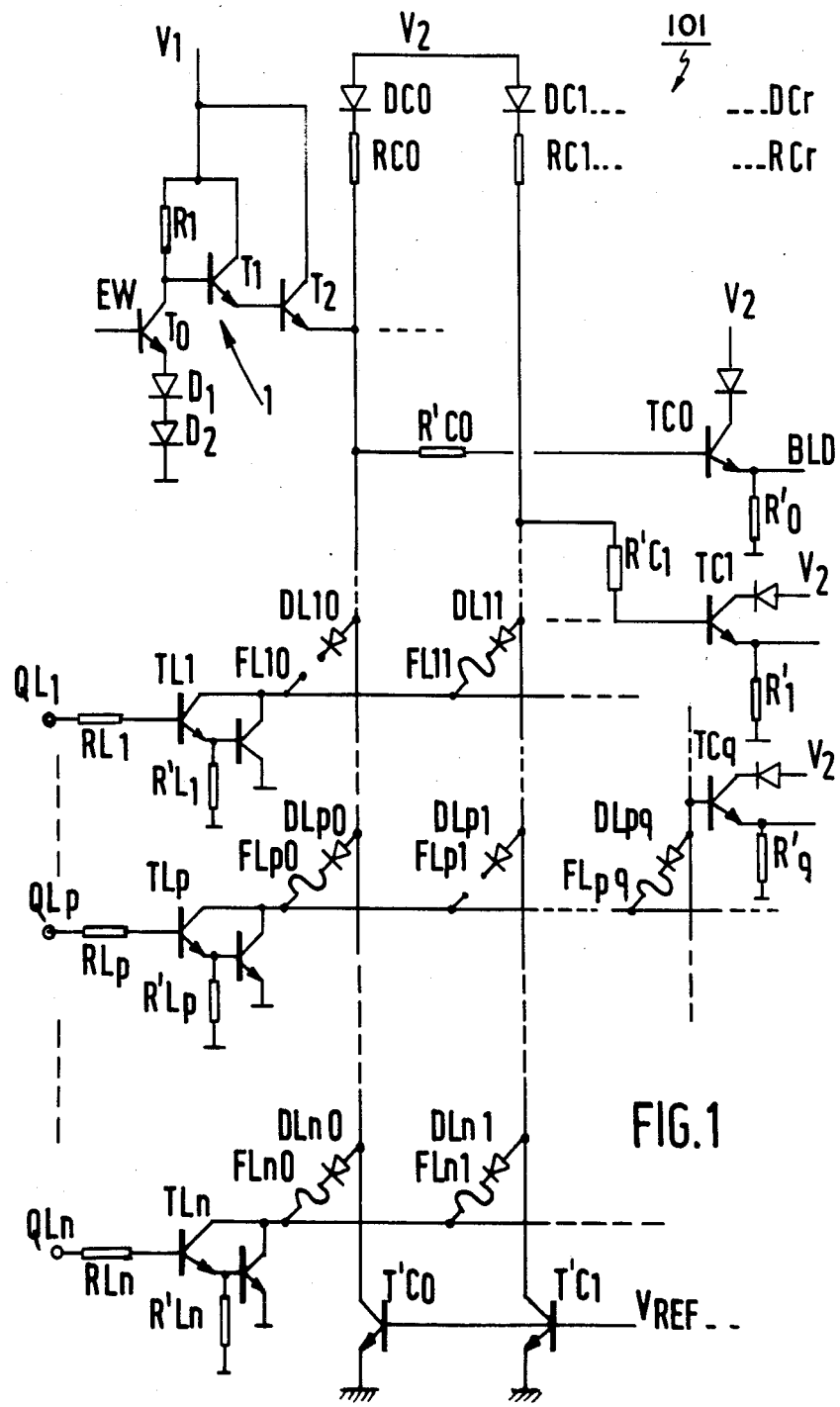
FIG. 1 shows a programmable memory for a tuning alignment data device according to the invention and also a circuit for the detection of a defective memory row.
Figure 2:
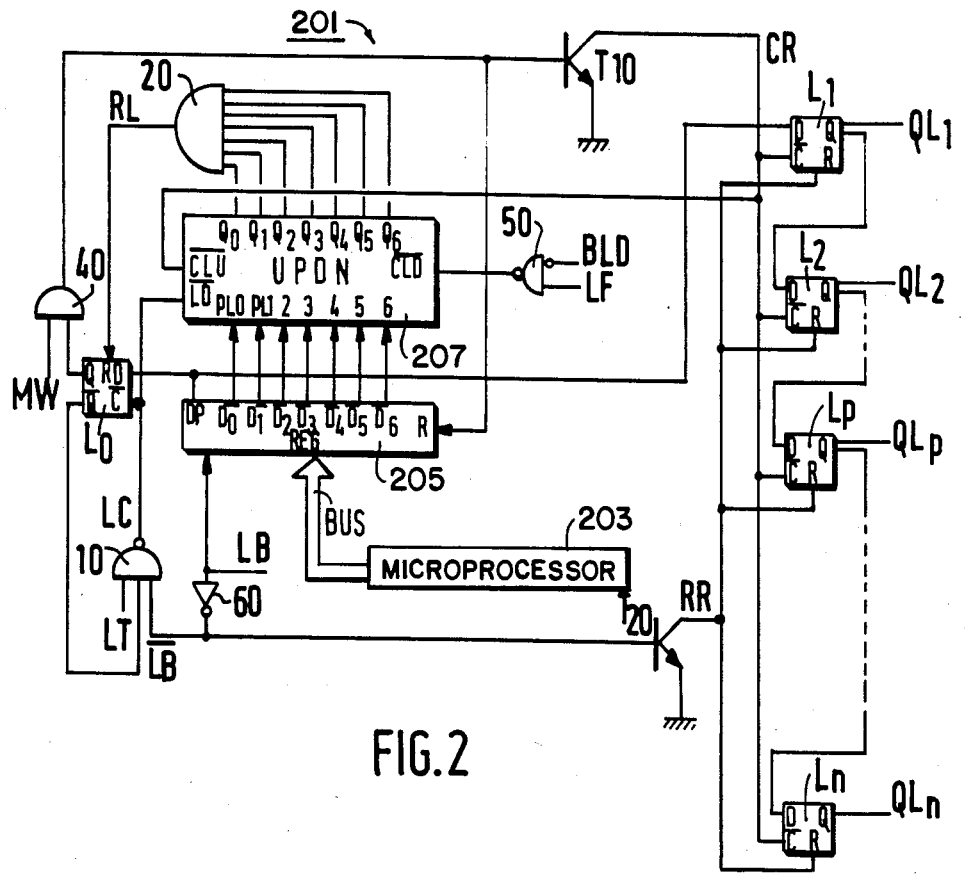
FIG. 2 shows a logic frequency selection circuit of a tuning alignment data memory device according to the invention.
Figure 3:
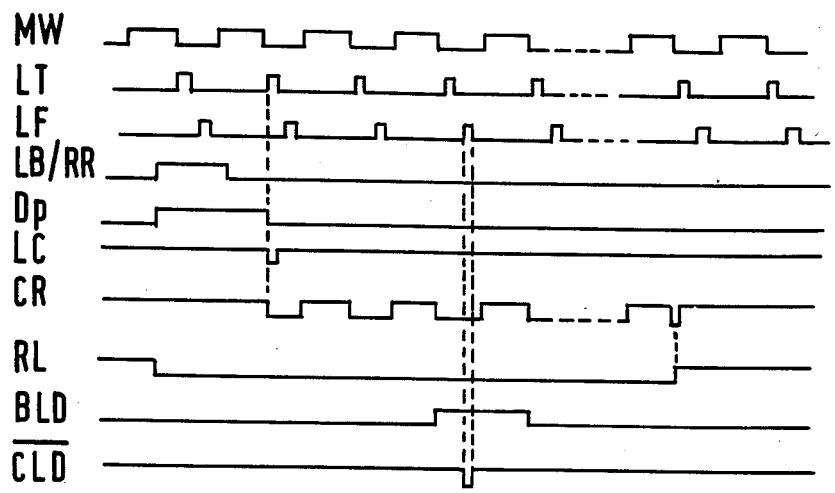
FIG. 3 shows the chronological sequence of signals which are characteristic of the mode of operation of the circuit of FIG. 2.

FIG. 1 shows the layout of a programmable tuning alignment data memory by means of which the invention can be put into effect. Writing into this memory is organized row-sequentially and for each row, column No. 0 is used for storing a write information element indicating the write state thereof. In other words, column No. 0 of the memory is reserved for the validation of information stored in a corresponding row. During the alignment procedure in the factory a preliminary test of the non-written memory is made. Thereafter, to write a memory row, a signal of a given frequency and a predetermined sequence of frequencies is fed to the tuner to be adjusted and in the manner described in the article mentioned in the foregoing, determining and storing of three tuning alignment data corresponding to correction voltage values characteristic for varicap diodes of the tuning circuits to be aligned are effected. Digital tuning alignment data corresponding to these three voltages are thus stored in the columns 1 to r of the memory, for example by using 5-bit words for each correction voltage value in a memory containing 16-bit rows. Thereafter, the information written in the corresponding row is tested and when it is approved, the row is validated by melting a corresponding fuse $FL_{no}$ of a memory column No. 0. When the tested information is faulty, a re-writing operation is effected in the subsequent row and the information is tested again with the object of validating this subsequently written row. This operation can be repeated as many times as poor rows are detected. When a row is validated, one proceeds in the subsequent row with the write operation and with validating the tuning alignment data corresponding to the next frequency in the sequence. By way of example, for entering a sequence of 80 channels, a memory having 100 rows of 16 bits each may be used, which leaves a very large safety margin in view of the fact that in practice faulty written rows are not so frequent. More specifically, the programmable memory having n rows and r columns includes for each column 0, 1 . . . r a write circuit $T_0$, $T_1$, $R_1$, $D_1$, $D_2$ fed with a voltage $V_1$ of the order of 12 V, so of a sufficiently high value to cause fuses FL of selected rows to melt when a Darlington circuit formed by a pair of transistors $T_1$ and $T_2$ is rendered conductive in reply to a write authorization signal EW applied to the base of a transistor $T_0$. Each of the columns of the memory is fed with a voltage $V_2$ of the order of 5 V, that is to say the value which permits reading of a selected row of the memory. Each column 0, 1, . . . , q, . . . , r comprises, taken in the direction from the end fed with the supply voltage $V_2$ and arranged one after the other, a diode $DC_0$, $DC_1$, . . . $DC_q$ . . . $DC_r$, a resistor $RC_0$, $RC_1$, . . . $R_q$, . . . $RC_r$, and n series arrangements of a diode DL and a fuse FL shunting the column and each respective row. Between a column of the order q and a row of the order p, the corresponding diode is referenced DLpq and the corresponding fuse is referenced FLpq. The other end of each column is fed by a current source including a transistor T'C0, . . . T'Cq . . . T'Cr whose bases are connected to a reference voltage $V_{REF}$. These current sources produce a small current such that the voltage levels at their collectors are remaining high if only these currents are flowing in their collector circuit. Each row can be selected by a Darlington circuit, referenced TLp, R'Lp fed by a row selection signal QLp via a resistor RLp. Reading each column is effected for the column of the order q by a transistor TCq arranged as an emitter follower whose base is connected to the corresponding column via a resistor R'Cq and whose emitter is connected to ground via a resistor R'q. When the row p is selected, the Darlington circuit TLp is conductive, and the transistor TCq driven by the column q is rendered non-conductive and consequently its output is at the low level when the fuse FLpq is still present. When the fuse FLpq has melted, the transistor TCq is conductive, and consequently its output is at the high level. All the components described in the foregoing are components which are suitable for the conventional mode of operation of programmable memories. The specific feature of the invention is that the column of the order 0 is reserved for the validation of information stored in the n lines. Thus, as mentioned in the foregoing, every correctly written row has the fuse corresponding to the column 0 being melted. When such a row is selected, the transistor TC0 is conductive and the signal BLD it provides at its emitter, and which acts as a write information signal, is at the high level. In contradistinction thereto, when a poor row (or a non-written line) is selected, the signal BLD is at the low level and applies an indication to a logic frequency selection circuit which will now be described with reference to FIGS. 2 and 3.

The logic frequency selection circuit receives input data supplied by a bus of a microprocessor and also a signal LB authorizing loading these data in a buffer register REG. The input data and the authorization signal LB are liable to appear at any moment as they correspond to a frequency loading command, given by an user of a tuner in which the tuning alignment data memory device is incorporated.

The logic frequency selection circuit generates three clock signals of the same frequencies, a first signal MW in the form of square-wave signals, and the other two, LT and LF, respectively, in the form of pulses which occur in the intervals in which the signal MW is at the low level.

The logic circuit includes an up/down counter UPDN having a load input $\overline{LD}$ acting on a descending edge of a signal LC to receive input data stored in the buffer register REG, with the exception of a data DP which is indicative of the presence of the input data.

The up/down counter UPDN has an up-counting input $\overline{CLU}$ and a down-counter $\overline{CLD}$ each acting on a descending edge of a signal fed thereto. A D-type, bistable multivibrator $L_0$ receives at its D-input the data DP, at its clock input $\overline{C}$, active on a descending edge of a signal fed thereto, the signal LC produces at the output of an inverting AND-gate 10, whose inputs receive the internal clock signal LT, a signal $\overline{LB}$, present at the output of an inverter 60 and also the inverted output signal $\overline{Q}$ of the bistable multivibrator $L_0$. A reset-to-zero input R of the bistable multivibrator $L_0$ receives a signal RL produced at the output of a multiple decoding gate 20, for example an AND-gate, whose inputs receive the outputs $Q_0$ . . . $Q_6$ of the up/down counter UPDN, in such a manner as to reset the bistable multivibrator $L_0$ to zero when the up/down counter UPDN has reached a predetermined count. The non-inverting output Q of the bistable multivibrator $L_0$ is fed to one of the two inputs of an AND-gate 40 whose other input receives the clock signal MW.

The output of the AND-gate 40 acts on the reset-to-zero input R of the buffer register REG and on the base of a transistor $T_{10}$ whose emitter is connected to ground and whose collector produces a signal CR which is used to clock a shift register comprising n cascaded D-type bistable multivibrators $L_1$ . . . $L_n$, i.e. the output QLp of the bistable multivibrator of the order p acts on the D-input of the bistable multivibrator of the order p+1 for all p comprised between 1 and n−1, and the signal CR acts on the clock input $\overline{C}$ which acts on a descending edge of its input signal, of each bistable multivibrator $L_1$ . . . $L_n$. The D-input of the first bistable multivibrator $L_1$ receives the signal DP which is indicative of the presence of information in the buffer register REG. The bistable multivibrators $L_1$ . . . $L_n$ are reset to zero by a signal RR obtained from the signal LB. To this end, the signal LB is applied to the input of an inverter 60 whose input acts on the base of a transistor $T_{20}$ whose emitter is connected to ground and whose collector is connected to the reset-to-zero inputs R of the bistable multivibrators $L_1 \ldots L_n$. The signals available at the Q-outputs of the bistable multivibrators $L_1 \ldots L_n$ are the signals $QL_1 \ldots QL_n$, respectively, which are applied to the row selection inputs of the programmable memory of FIG. 1.

A frequency selection operation will now be described. The BUS conveys in the buffer register REG an 8-bit address information and also the loading authorizing signal LB. The inverse logic values of each of the bits of the address information are then present at the inverting outputs $\overline{D_0}$, $\overline{D_1}$, $\overline{D_6}$ of the register REG.

The presence of the high signal LB, and consequently of $\overline{LB}=0$ at the input of the gate 10, inhibits the passage of the signal LT through this gate. LB then resturns to zero, and since the bistable multivibrator $L_0$ has its output Q at zero ($\overline{Q}=1$), the first then occurring pulse of the signal LT which, as mentioned in the foregoing, occurs when the signal MW is at the low level, adjusts the signal LC to the low level. The inputs $PL_0$, $PL_1$ .. . $PL_6$ of the up/down counter UPDN are then loaded by the logic complement of the address information bits obtained from the BUS. The signal DP adjusts the output Q of the bistable multivibrator $L_0$ to the high level at the moment at which LC is at the low level, i.e. at the same time that the counter UPDN is loaded. The output Q of the bistable multivibrator $L_0$ then authorizes the signal MW to pass through the gate 40, which resets the buffer register REG to zero, which more specifically causes DP to pass to zero at the same time at which the signal CR clocks the inputs $\overline{C}$ of the bistable multivibrators $L_1 \ldots L_p$ of the shift register, and consequently adjusts to 1 the output Q of the bistable multivibrator $L_1$ which addresses the first line of the programmable memory. The signal CR is also fed to the input $\overline{CLU}$ of the counter UPDN and causes it to increment by one. Moreover, the output $\overline{Q}=0$ of the bistable multivibrator $L_0$ blocks the gate 10 and prevents any passage of the clock pulses LT.

When the first row of the memory is good, then BLD is at the high level and the output of the gate 50 remains at the high level. At each subsequent passage to the low level of the signal MW and consequently of CR, the shift register is clocked, and the high level present at the output of the bistable multivibrator $L_1$ sequentially circulates to the bistable multivibrators $L_2$, $L_3$ ... If it is assumed that the line p is defective, then a low level BLD authorized by LF causes the output signal of the gate 50 to zero and the counter UPDN to be decremented by one (input $\overline{CLD}$). In that case, by switching the register for addressing the memory row p, the up/down counter UPDN is incremented by one unit when MW changes to the low level, and is decremented by one unit at the instant at which LF occurs, so when MW is still at the low level. As a result thereof, if LF occurs when BLD is high everything continues as if the row p has not yet been written and the row of the order (p+1) in which the $p^{th}$ valid information is written is taken into account now by the up/down counter UPDN as the $p^{th}$ line of the sequence. The signal BLD remains present during one clock period of the signal MW, until the line (p+1) is selected.

These operations continue until the up/down counter UPDN has reached a predetermined count, namely 1111111 in the case in which the gate 20 is a multiple AND-gate. In that case the signal RL at the output of the gate 20 resets the bistable multivibrator $L_0$ to zero (input R), whose output Q renders the gate 40 non-conductive which causes the last selected line to remain selected until a new high signal LB appears which resets the shift register to zero. The characteristic parameters of the selected frequency of the tuner can be obtained from the memory and taken into account by the receiver in the manner described in the publication mentioned in the foregoing.

I claim:

1. A tuning alignment data memory device for tuning circuits tunable to selectable frequencies in which digital tuning alignment data corresponding to said frequencies are stored in a programmable memory (PROM) associated with said circuits, being selectable by a logic frequency selection circuit and suitable for having the associated digital tuning alignment data correspond to the selectable frequencies, characterized in that the programmable memory comprises for each selectable frequency a write row containing a write information position for a write information element indicating whether tuning data written in this row has been written correctly or not, in that tuning alignment data written in these rows are sequentially arranged in accordance with a predetermined frequency order, in that for each defective write row the digital tuning alignment data of a defective write row are written again in the subsequent write row and in that the logic frequency selection circuit comprises:

a buffer register receiving a first address corresponding to a selected frequency;

an up/down counter clocked by a first clock signal until it has reached a second address;

a shift register clocked by said first clock signal and acting such that its output sequentially addresses write rows of the programmable memory;

a first logic gate detecting whether the up/down counter has reached said second address and whose output blocks said first clock signal when the second address has been reached; and a logic detection circuit of said write information element whose output is designed such as to decrement the up/down counter by one step in the case in which said write information element corresponds to a defective write row, such that, for a first address corresponding to a $k^{th}$ frequency, the shift register remains in a position in which it addresses a validly written $k^{th}$ row of the programmable memory, after having sequentially scanned validly written (k−1) first rows and defectively written rows.

2. A device as claimed in claim 1, characterized in that the buffer register receives a load authorization signal (LB) in synchronism with said first address, which authorizes a passage of one pulse of a second clock signal (LT) having the same period as the first clock signal, but shifted in time relative to this first clock signal, to be applied to the clock signal input of a D-type bistable multivibrator whose input receives from the buffer register a signal (DP) which is representative of an effective load of the first address, and whose output, when it is in its high state unblocks the first clock signal, and is reset to zero by an output signal of the first logic gate.

3. A device as claimed in claim 2, characterized in that the shift register is reset to zero by said load authorizing signal (LB) and at its input receives said signal (DP) which is representative of the effective load of the first address in the buffer register.

4. A device as claimed in claim 3, characterized in that it includes a second logic gate receiving an output signal of the logic detection circuit and also a signal from a third clock signal (LF) having the same period as the first clock signal, but shifted in time relative to this first clock signal, in such a manner as to synchronize the up/down counter when it is decremented by one step.

* * * * *